United States Patent [19]

Langer et al.

[11] Patent Number: 5,768,296
[45] Date of Patent: Jun. 16, 1998

[54] ECC SYSTEM SUPPORTING DIFFERENT-LENGTH REED-SOLOMON CODES WHOSE GENERATOR POLYNOMIALS HAVE COMMON ROOTS

[75] Inventors: Diana Langer, Northboro; Michael Leis, Framingham; Cecil Macgregor, Milford; Lih-Jyh Weng, Shrewsbury, all of Mass.

[73] Assignee: Quantum Corporation, Milpitas, Calif.

[21] Appl. No.: 761,689

[22] Filed: Dec. 6, 1996

Related U.S. Application Data

[63] Continuation of Ser. No. 269,589, Jul. 1, 1994, abandoned.
[51] Int. Cl.$^6$ .................................................. H03M 13/00
[52] U.S. Cl. ................................ 371/37.11; 371/37.01
[58] Field of Search ............................. 371/37.1, 37.2, 371/37.4, 37.6, 37.7, 38.1, 40.1, 40.2, 37.01, 40.11, 37.11

[56] References Cited

U.S. PATENT DOCUMENTS

| | | | |
|---|---|---|---|
| 4,608,692 | 8/1986 | Nagumo et al. | 371/37 |
| 4,654,853 | 3/1987 | Moriyama et al. | 371/41 |
| 4,675,869 | 6/1987 | Driessen | 371/37 |
| 4,701,923 | 10/1987 | Fukasawa et al. | 371/41 |
| 4,835,629 | 5/1989 | Ueno et al. | 360/53 |
| 4,922,494 | 5/1990 | Pirani et al. | 371/35 |
| 5,107,503 | 4/1992 | Riggle et al. | 371/37.1 |
| 5,267,248 | 11/1993 | Reyner | 371/25.1 |
| 5,375,127 | 12/1994 | Leak et al. | 371/40.1 |
| 5,379,305 | 1/1995 | Weng | 371/37.1 X |
| 5,428,630 | 6/1995 | Weng et al. | 371/40.1 |
| 5,444,719 | 8/1995 | Cox et al. | 371/37.1 |
| 5,465,260 | 11/1995 | Zook | 371/37.6 |
| 5,473,620 | 12/1995 | Zook et al. | 371/37.1 |
| 5,487,077 | 1/1996 | Hassner et al. | 371/40.1 |

*Primary Examiner*—Reba I. Elmore
*Assistant Examiner*—Robert J. Dolan
*Attorney, Agent, or Firm*—David B. Harrison; Debra A. Chun

[57] ABSTRACT

A Reed-Solomon error-correction coding (ECC) scheme selectively supports two different-length codes to optimize the trade-off between error performance and the amount of disk space required to store protection symbols. The encoder contains two sets of alpha multipliers; part of one set is multiplexed with the other depending on which code is being used. Also, a shift register within the encoder is selectively lengthened or shortened depending on the code. The code pair is selected so that the generator polynomial of the shorter code is a complete divisor of the generator polynomial of the longer code. Thus, one code is a sub-code of the other. Accordingly, the ECC system is able to use the same syndrome calculator for each code. The error-correction decoder uses those syndromes that correspond to the roots of the generator polynomial of the code being used.

2 Claims, 4 Drawing Sheets

ECC SYSTEM SUPPORTING DIFFERENT-LENGTH REED-SOLOMON CODES WHOSE GENERATOR POLYNOMIALS HAVE COMMON ROOTS

This application is a continuation of application Ser. No. 08/269,589 filed Jul. 1, 1994, now abandoned.

FIELD OF THE INVENTION

The invention relates to the field of error-correction coding (ECC) systems.

BACKGROUND OF THE INVENTION

Error-correction coding is used in many applications to protect the integrity of data that is subject to error-inducing noise. The data to be protected is passed through an encoder that appends protection symbols to the data according to the code being used. The nature of the code is such that the combination of the data and protection symbols can subsequently be decoded to yield the original data even if some of the symbols have been corrupted due to noise.

One common use of error-correction coding is in disk drives, where the data being stored is subject to noise caused by media defects, for example. The present invention is described below in the context of a disk drive; however, those skilled in the art will appreciate that the principles have general applicability to other applications where data protection is necessary.

One class of error-correcting code that is commonly used in disk drives and other applications is the class of Reed-Solomon (RS) codes. These codes are block codes having special mathematical properties that are exploited to attain some of the objects of the present invention. Each RS code is associated with a corresponding field of numbers called a Galois field. Each Galois field is defined by a corresponding set of elements, or numbers, along with multiplication and addition operations. Each RS code is defined by a generator polynomial that expresses the mapping between the un-encoded data words and codewords used to represent them, where each codeword consists of a series of elements from the Galois field associated with the RS code. The generator polynomial can be expressed as either a weighted sum of powers of field elements or as a product of binomials each having the form $(x-\alpha^i)$, where $\alpha^i$ is one of the roots of the generator polynomial. For RS codes, the number of generator polynomial roots is equal to the number of protection symbols added to the un-encoded data, and is also approximately equal to twice the error-correcting power of the code. For example, an RS code with 7 roots in its generator polynomial can correct up to 3 symbol errors in a codeword.

Use of a longer codeword, then, generally increases the error-correcting power of an RS code, because more protection symbols are being used. However, longer codewords obviously require more storage space than shorter ones representing the same information. Accordingly, increased error-correction power generally comes at the expense of usable storage space or capacity. Therefore, in the design of a disk drive product there is generally a trade-off that must be made between the error-correcting power of the code and the usable storage capacity of the disk drive. This trade-off may be made in favor of error-correcting power in a product that must perform with high reliability or availability, whereas the trade-off may go the other way in applications where data integrity is not as critical. Also, because different products may use different media that yield very different raw error rates, obtaining the same post-decoding error rate in different products can require the use of different-strength codes. Accordingly, there has been and continues to be the need to use different-strength codes in different disk drive products.

Typically, however, this need is generally met either by using a single, compromise coding scheme on all products, or by using a unique coding solution for each product with different coding and capacity needs. Using a single compromise coding scheme helps to minimize the overall cost of designing the various products in which it is used. But such a scheme also means that every product tends to be either over- or under-designed, and may thus be burdened with excess cost or complexity, or with inadequate performance for some applications. In contrast, using unique coding solutions on every product tends to optimize their respective characteristics, but also increases the cost of designing each product, which of course translates into increased product cost. This tension between design efficiency and the optimization of product characteristics is one major problem with which the current invention is concerned.

SUMMARY OF THE INVENTION

In light of the foregoing, it is an object of the invention to enable a single encoder/decoder pair to be used on a variety of storage products having different error-protection and storage capacity requirements. It is also an object to achieve this functionality while keeping the size and complexity of the coding hardware and/or firmware to a practical minimum.

In one aspect, the invention is an error-correction encoder having the following elements: (1) a shift register having an input coupled to a data input terminal of the encoder and having $(d_1-1)$ storage elements, where $(d_1-1)$ is the degree of a first generator polynomial defining a distance-$d_1$ Reed-Solomon (RS) code according to which a data block may be encoded and whose code symbols are elements of a predetermined Galois field having a predetermined primitive element $\alpha$; (2) a set of Galois-field adders interspersed among the storage elements of the shift register such that each adder provides to the input of a corresponding one of the storage elements the sum of the contents of the preceding storage element appearing on one input thereof and whatever value appears on the other input thereof; (3) a first set of Galois-field multipliers, each having a data symbol input coupled to the data input terminal and being capable of multiplying the value appearing on its data symbol input by a corresponding power of $\alpha$ appearing in the first generator polynomial; (4) a second set of Galois-field multipliers each having a data symbol input coupled to the data input terminal and being capable of multiplying the value appearing on its data symbol input by a corresponding power of $\alpha$ appearing in a second generator polynomial being a complete divisor of the first generator polynomial and defining a distance-$d_2$ RS code according to which the data block may be encoded and whose code symbols are, like those of the distance-$d_1$ RS code, elements of the predetermined Galois field; (5) means for selectively configuring the shift register so that all $(d_1-1)$ elements thereof are used when the data block is to be encoded according to the distance-$d_1$ RS code, and only $(d_2-1)$ elements thereof are used when the data block is to be encoded according to the distance-$d_2$ RS code, the elements that are used for both codes being denoted "shared" elements and the remainder being denoted "non-shared" elements; (6) means for coupling the output of each of predetermined ones of the first set of Galois-field multipliers to the other input of a corresponding appropriate one of those of the adders that provide sums to the inputs of the non-shared elements of the shift register to effect encoding by the distance-$d_1$ RS code when the shift register is configured therefor; and (7) means for selectively coupling the outputs of each of either the remaining ones of the first set of Galois-field multipliers or all of the second set of Galois-field multipliers to the other input of a corresponding appropriate one of those of the adders that provide sums to the inputs of the shared elements of the shift register to effect encoding by the corresponding one of the RS codes.

This aspect of the invention allows an encoder to support both a longer code as well as a shorter one with only an incremental increase in its size and complexity. Accordingly, it helps enable different products to have more optimal trade-offs between error-correction power and storage space without requiring unique coding designs for each product. Also, as is described below this configuration is easily extendable to encoders for more than two codes, and can also take advantage of any special properties of the specific RS codes being used to achieve even greater benefits.

In another aspect, the invention is an error-correction decoder having the following elements: (1) a syndrome calculator for generating ($d_1$-1) error syndromes from a codeword encoded according to either a distance-$d_1$ Reed-Solomon (RS) code or a distance-$d_2$ RS code the roots of whose generator polynomial are a consecutive subset of the roots of the generator polynomial of the distance-$d_1$ RS code, the generated syndromes being consecutively numbered to correspond to the consecutive roots of the generator polynomial of the distance-$d_1$ RS code; (2) means for indicating which of the RS codes is the one according to which the codeword is encoded; and (3) an error-correction decoder coupled to the indicating means and to the syndrome calculator for determining the presence, locations, and magnitudes of symbol errors in the codeword based on the values of those of the generated syndromes that correspond to the roots of the generator polynomial of the indicated RS code.

A decoder according to this second aspect of the invention enables the syndrome calculator to be shared by both codes, helping to minimize the amount of additional hardware required for two-code support. Also, in some cases the decoder can be divided into a hardware component that corrects a small number of errors and a software component that kicks in if the small number of errors is exceeded. In such a case, it is possible to use the same hardware correction component if the small number of errors is within the power of the shorter code. All that is required in such a case is that the hardware decoder be capable of selecting the proper calculated syndromes for the code being used. Again, the configurability of the decoder enables different products to achieve a more optimum trade-off between error-correction power and storage space without requiring a completely different coding scheme from other products.

BRIEF DESCRIPTION OF THE DRAWINGS

An embodiment of the invention will be described with reference to the accompanying drawings, in which.

DETAILED DESCRIPTION

Figure 1:
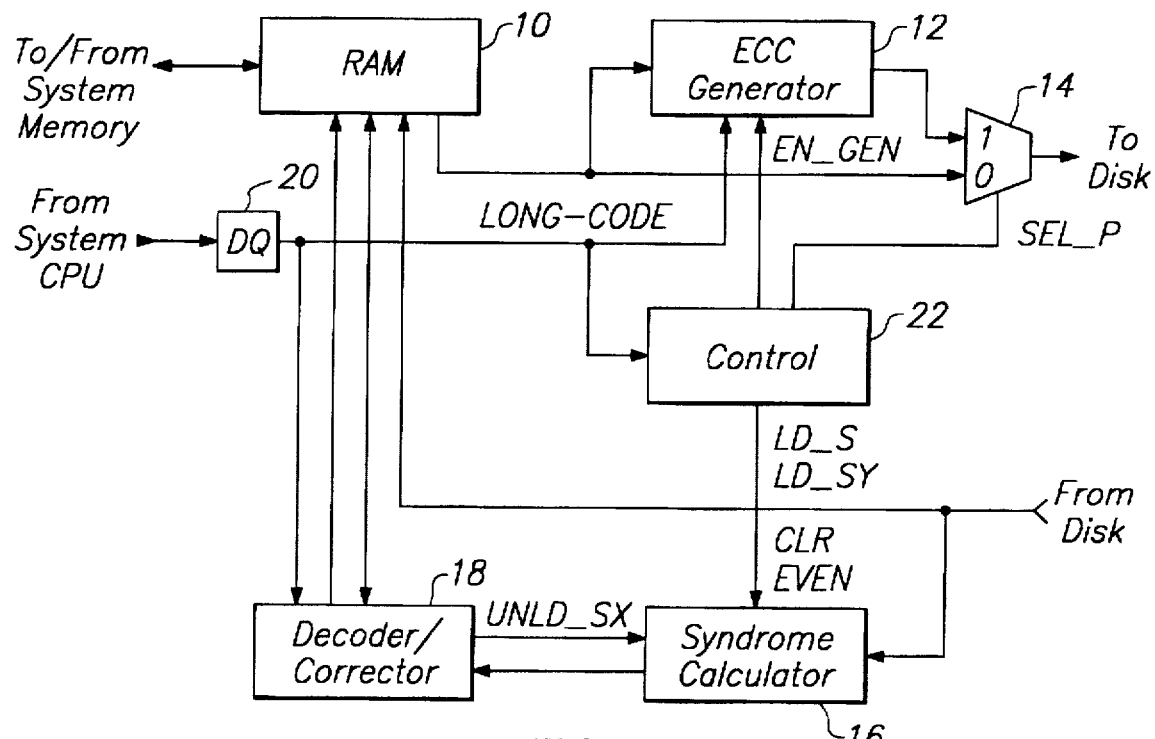
FIG. 1 is a block diagram of an error-correction coding system in accordance with the principles of the invention.

FIG. 1 shows a block diagram of an error-correction coding system that is part of the data path of a disk controller. A random-access memory (RAM) 10 is coupled to the main memory in a computer system (not shown) and serves as a buffer for data being written to or read from a disk (also not shown). In the disk write path, data symbols from the RAM 10 are provided to an error-correction code (ECC) generator 12 which calculates the ECC protection symbols from this input data stream. The data symbols from the RAM 10 are also provided, along with the output of the ECC generator 12, to a 2:1 multiplexer 14, whose output is provided to the disk.

In the disk read path, the data and ECC that are read from the disk are provided to the RAM 10, and also to a syndrome calculator 16. The output from the syndrome calculator 16 is provided to an error-correction decoder 18. The decoder 18 determines the number, locations, and magnitudes of symbol errors in the data stream, and accesses the RAM 10 to read, correct and write back symbols that have been read from the disk.

A control block 22 generates several control signals as follows to control the operations of the ECC generator 12 and the syndrome calculator 16:

| Signal Name | Function |
| --- | --- |
| EN_GEN | Enable generation of ECC protection symbols |
| LD_S | Load syndrome accumulator registers |
| LD_SY | Load syndrome output registers |
| CLR | Clear syndrome accumulator registers |
| EVEN | Operate on even-numbered syndrome |
| SEL_P | Select protection symbols for writing to disk |

The use of these signals is described in greater detail below.

The error-correction decoder 18 also generates a control signal, UNLD_SY, that commands the syndrome calculator 16 to send the calculated syndromes to the decoder 18. The use of this signal is also described in greater detail below.

The system of FIG. 1 also includes a latch 20 that is written from a system central processor (CPU) (not shown) with a configuration flag LONG_CODE. When this flag is set to a logic ONE, the coding system is configured to encode and decode the data symbols according to a distance-12 Reed-Solomon (RS) code having 11 protection symbols added to the data. Alternatively, this flag can be set to a logic ZERO, so that the coding system is configured to encode and decode the data symbols according to a distance-8 RS code having 7 protection symbols added to the data. Both these codes and the selectability features are described in greater detail below.

Figure 2:
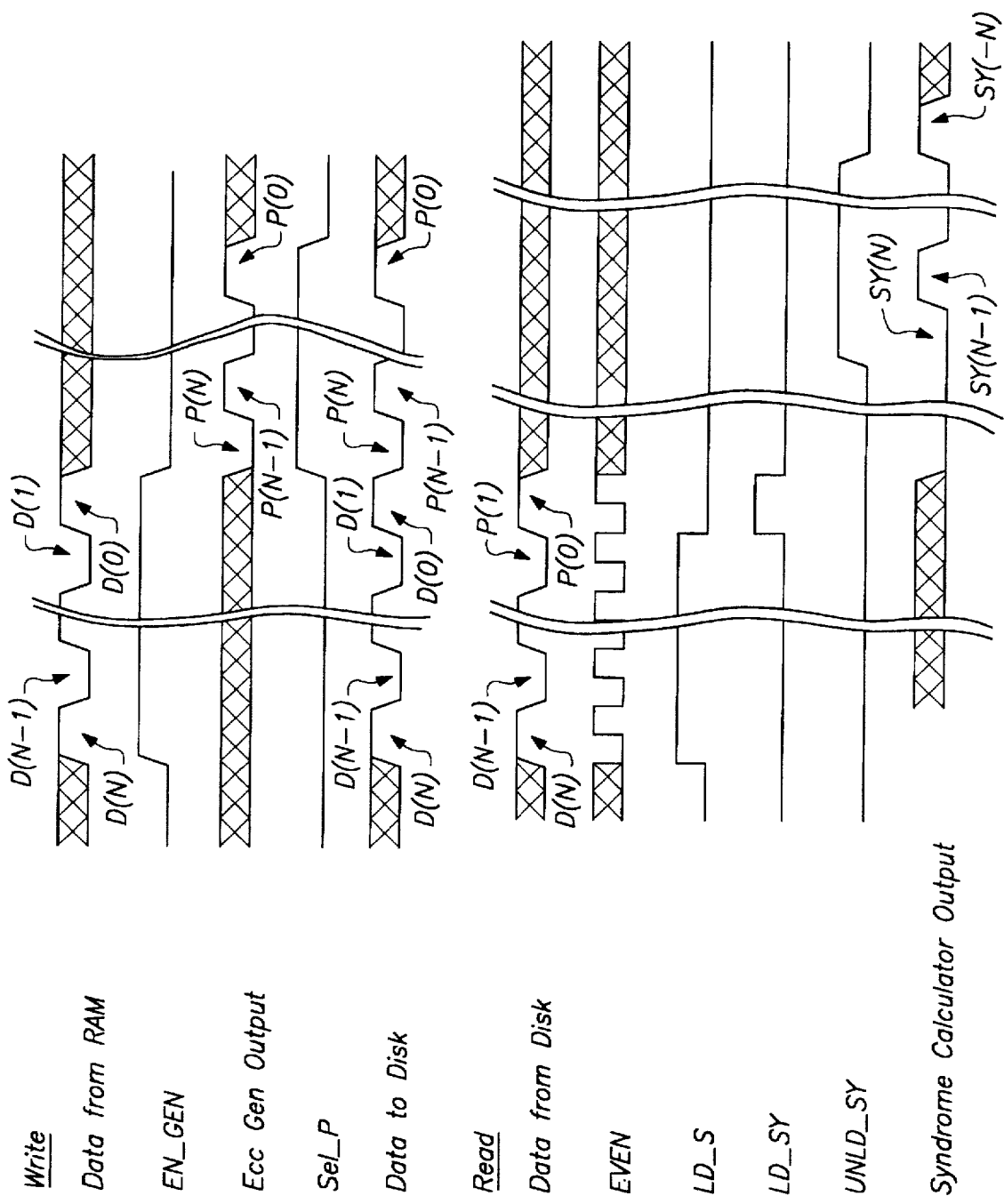
FIG. 2 is a timing diagram of various signals in the system of FIG. 1.

FIG. 2 shows the relative timing of various signals in the system of FIG. 1 for both writes to and reads from the disk. During the initial part of a write, the signal SEL_P is deasserted, so that data symbols labelled D(N)–D(0) from the RAM 10 are being written to the disk through the multiplexer 14. Meanwhile, the signal EN_GEN is asserted, so the ECC generator 12 is calculating the protection symbols labelled P(N)–P(0). After the last data symbol D(0) has been written, the signal SEL_P becomes asserted, so that the calculated protection symbols are written immediately thereafter through the multiplexer 14.

On a read, all the data and protection symbols flow simultaneously into the syndrome calculator 16 and the RAM 10. The signal LD_S is asserted to cause the syndrome calculator to accumulate partial error syndromes from the incoming data and protection symbols. The signal EVEN toggles as shown; the reason for this behavior is explained below. When the last protection symbol P(0) arrives, the signal LD_S becomes deasserted an d the signal LD_SY becomes asserted. This causes the syndrome calculator 16 to calculate and store the final syndrome values. As shown, the output of the syndrome calculator 16 then becomes the highest-numbered syndrome labelled SY (N). At some later time, the signal UNLD_SY becomes asserted, and the syndrome calculator 16 then outputs the syndromes SY (N−1) . . . . . SY (−N) as shown.

Although in FIG. 2 the letter "N" is used to number data symbols, protection symbols, and syndromes, this labelling is merely a convenience and does not mean that there are an equal number of these various items. Indeed, it will be clear to those skilled in the art that there are typically far fewer protection symbols P than data symbols D in a practical RS code. Also, as is described below, the number of syndromes SY can vary, and in general is different from both the number of data symbols and the number of protection symbols.

Figure 3:
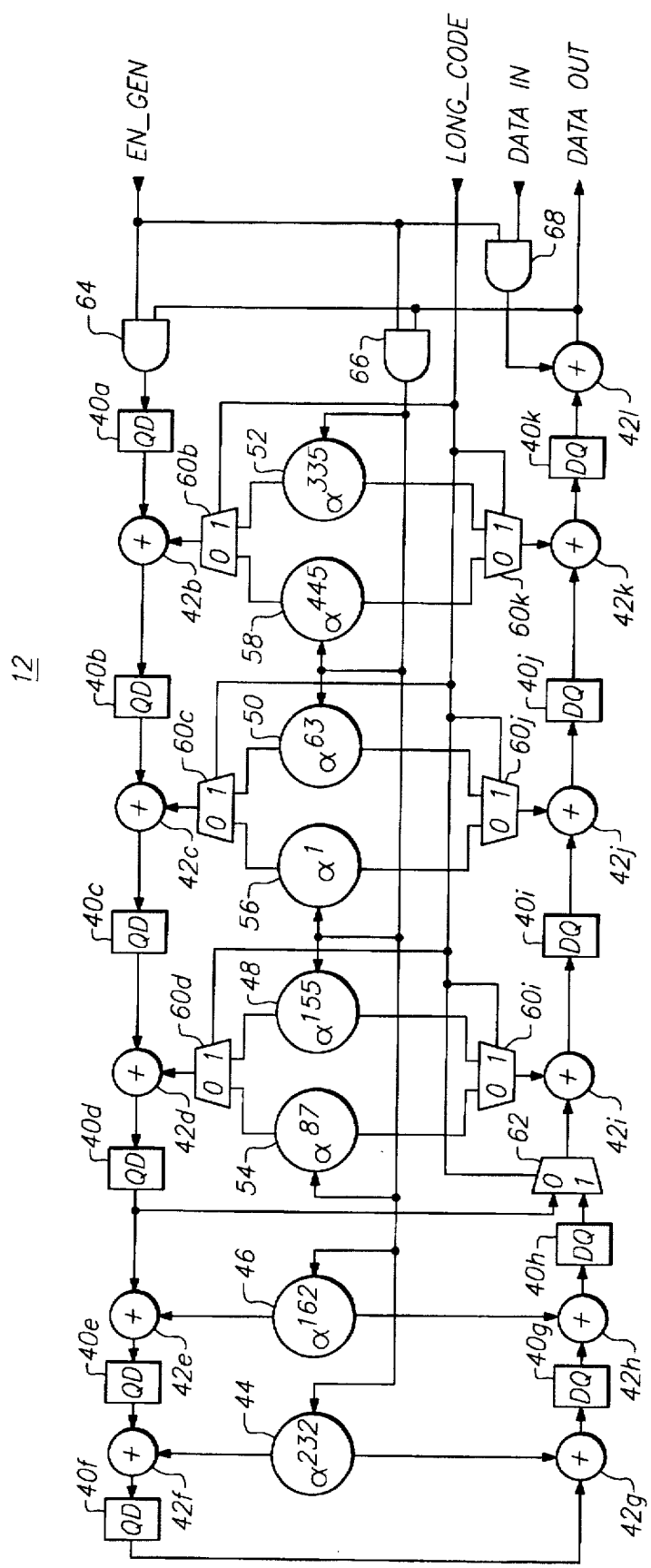
FIG. 3 is a logic diagram of an error-correction encoder in the system of FIG. 1.

FIG. 3 shows the ECC generator 12 in greater detail. As already indicated, it is capable of encoding the input data stream according to either a first, distance-12 Reed-Solomon (RS) code or a second, distance-8 RS code. The codes are generated by respective generator polynomials in the Galois field $GF(2^9)$ generated by the binary primitive polynomial $x^9 + x^{4+1}$ as follows:

$$GP_1 = x^{11} + \alpha^{335}x^{10} + \alpha^{63}x^9 + \alpha^{155}x^8 + \alpha^{162}x^7 + \alpha^{232}x^6 + \alpha^{232}x^5 + \alpha^{162}x^4 + \alpha^{155}x^3 + \alpha^{63}x^2 + \alpha^{335}x + 1$$

$$GP_2 = x^7 + \alpha^{445}x^6 + \alpha x^5 + \alpha^{87}x^4 + \alpha^{87}x^3 + \alpha x^2 + \alpha^{445}x + 1$$

where $\alpha$ is a primitive element in $GF(2^9)$ The various powers of $\alpha$ are calculated in a known manner from the above-mentioned primitive polynomial. One important characteristic of the pair of polynomials described above is that $GP_2$ completely divides $GP_1$ put another way, the roots of $GP_2$ are a subset of the roots of $GP_1$. This relationship means that both RS codes can use the same syndrome calculator, and also that the codes can possibly share the same decoding algorithm up to the error correcting power of the weaker code. It will also be noted that the coefficients of both $GP_1$ and $GP_2$ are symmetric, and the coefficients of the lowest and highest powers of x are 1. While neither of these characteristics is essential to the practice of the invention, they nevertheless help to simplify the hardware implementation associated with these two RS codes.

The thicker lines in FIG. 3 represent 9-bit data paths in correspondence with the 9-bit symbol size for the codes described above.

The ECC generator 12 employs a shift register having 11 storage elements 40a–40k. Elements 40a–40d and 40i–40k are denoted as "shared" elements, because they are used regardless of which RS code is being used to encode the data; elements 40e–40h are denoted as "non-shared" because they are only used for the longer, distance-12 RS code. Interspersed among the storage elements are Galois field (GF) adders 42b–42l, which may be conveniently implemented as sets of exclusive-OR (XOR) gates and so are also referred to as "exclusive-or adders". Also appearing in the encoder 12 are several Galois-field multipliers, referred to herein as "alpha multipliers", each capable of multiplying its data input by a corresponding power of $\alpha$. The alpha multipliers are divided into two sets. A first set, corresponding to $GP_1$, consists of multipliers for $\alpha^{232}$ 44, $\alpha^{162}$ 46, $\alpha^{155}$ 48, $\alpha^{63}$ 50, and $\alpha^{335}$ 52. A second set, corresponding to $GP_2$, consists of multipliers for $\alpha^{87}$ 54, $\alpha^1$ 56, and $\alpha^{445}$ 58. Each of the three alpha multipliers 48, 50, and 52 of the first set is multiplexed with a corresponding one of the alpha multipliers 54, 56, and 58 of the second set via corresponding pairs of 2:1 multiplexers 60b–60d and 60i–60k. The outputs of these multiplexers are fed into adders 42b–42d and 42i–42k that feed the shared storage elements 40b–40d and 40i–40k. The remaining adders 42e–42h are fed directly by the corresponding one of the non-multiplexed alpha multipliers 44 and 46 as shown.

Each of the multiplexers 60b–60d and 60i–60k receives the signal LONG_CODE on its select input. When the signal LONG_CODE is asserted, the encoder is configured to encode according to the first RS code; otherwise, it is configured to encode according to the second RS code. Accordingly, the outputs of the alpha multipliers corresponding to $GP_1$ are selected when the signal LONG_CODE is asserted, and otherwise the outputs of the alpha multipliers corresponding to $GP_2$ are selected.

In the embodiment shown in FIG. 3, two multiplexers are used per shared section of the shift register. This arrangement makes it easier to place the encoder components on a planar integrated circuit. It is possible, however, to use only a single multiplexer per section, and drive both the upper and lower adders with its output. For example, multiplexers 60i–60k could be removed, and the inputs to adders 42i–42k driven by multiplexers 60d–60b. In a similar vein, it may be advantageous to use separate duplicate sets of alpha multipliers for the top and bottom halves of the shift register rather than share a single set as shown.

A configuration multiplexer 62 is employed to adjust the length of the shift register depending on which of the two RS codes is being used. This multiplexer also receives the signal LONG_CODE on its select input. When the signal LONG_CODE is asserted, indicating that the first RS code is being used, stage i is fed by immediately-preceding stage h. When the signal LONG_CODE is de-asserted, however, stage i is instead fed by stage d, so that the non-shared stages e–h are bypassed and the shift register is shortened for use with the shorter code.

Also shown in FIG. 3 are AND gates 64, 66, and 68 that are used in a conventional fashion to control the operation of the ECC generator 12. In particular, AND gates 64 and 66 enable the data output to be fed back to the shift register input when the protection symbols are being calculated, and otherwise serve to feed ZEROs into the shift register in preparation for a subsequent calculation. Likewise, AND gate 68 gates the input data into the shift register during calculation, and prevents data on the input port from interfering with the protection symbols as they are clocked out when calculation is complete.

Although not shown in FIG. 3, it may be desirable in alternative embodiments of the encoder to enable the storage elements 40a–40k to be cleared by an external signal. This feature might be necessary to clear some of the stages of stale symbols if the encoder length is changed back and forth between long and short during operation.

Figure 4:
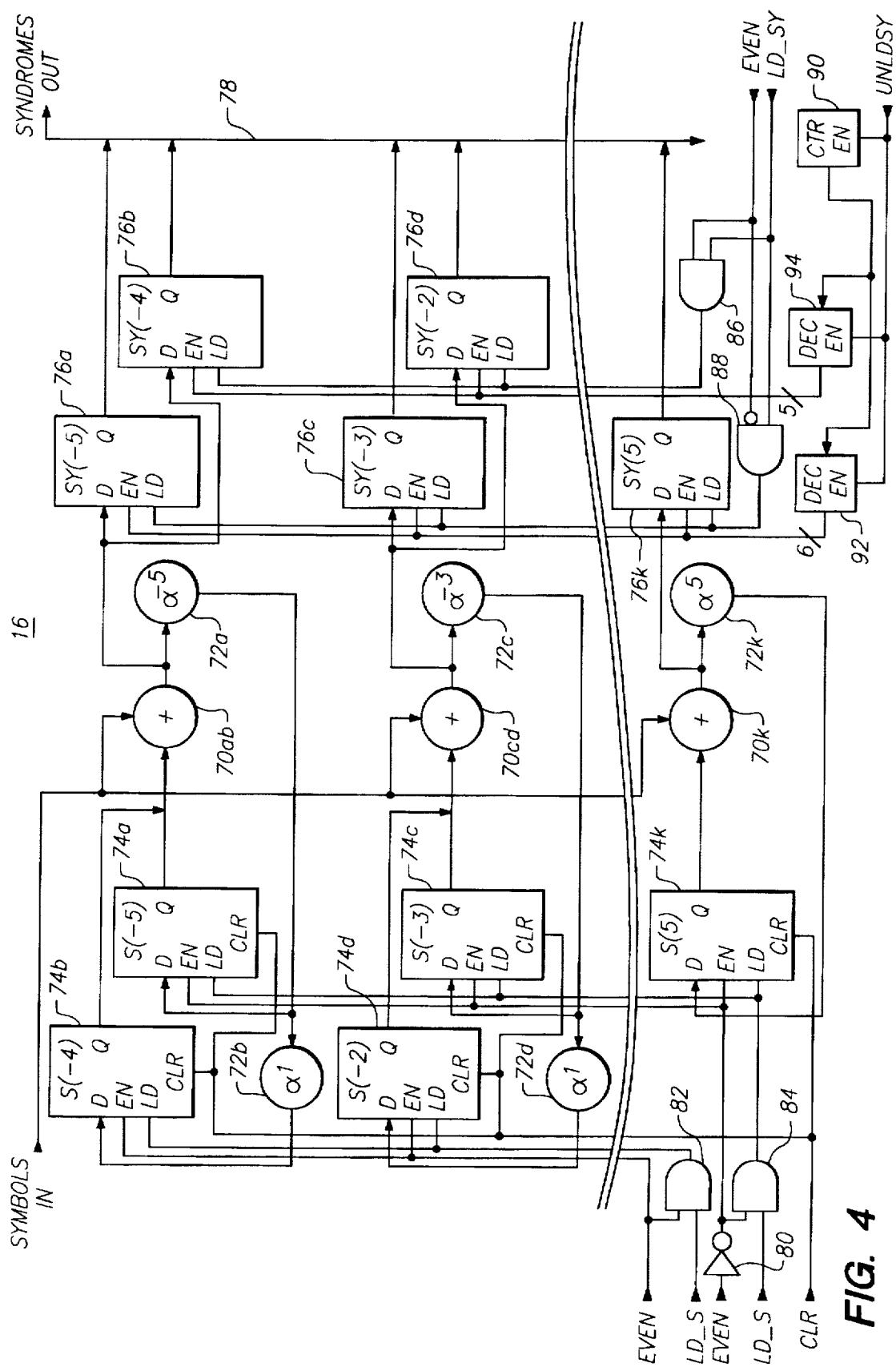
FIG. 4 is a logic diagram of a syndrome calculator in the system of FIG. 1.

Turning now to FIG. 4, the details of the syndrome calculator 16 of FIG. 1 are shown. In the data path, the input symbols are broadcast to a number of GF adders 70ab, 70cd, 70ef, 70gh, 70ij, and 70k. The output of each adder feeds a corresponding one of alpha multipliers 72a ($\alpha^{-5}$), 72c ($\alpha^{-3}$) 72e ($\alpha^{-1}$), 72g ($\alpha^1$), 72i ($\alpha^3$), and 72k ($\alpha^5$). The multiplier outputs in turn feed another set of alpha multipliers 72b, 72d, 72f, 72h, and 72j, all of which multiply by $\alpha^1$. The multiplier outputs also feed S-accumulator latches 74a, 74c, 74e, 74g, 74i, and 74k. The outputs from the $\alpha^1$-multipliers 72b, 72d, 72f, 72h, and 72j feed corresponding ones of S-accumulator latches 74b, 74d, 74f, 74h, and 74j. For each adjacent pair of accumulator latches, either one can be selected as an input for the corresponding GF adder. For example, either of latches 74a and 74b can provide an input to GF adder 70ab. The outputs from the adders 70ab, 70cd, 70ef, 70gh, 70ij, and 70k also feed corresponding pairs of Sy-accumulator latches 76a–76k, whose outputs in turn are selectively provided to the error correction decoder 18 of FIG. 1 via bus 78.

One noteworthy feature in FIG. 4 is that each stage except stage k calculates two syndromes, so that the number of stages required is about half of a conventional syndrome calculator. This is accomplished by having two S-accumulator latches share a corresponding adder and alpha multiplier and performing two calculations for each input symbol. Also, as shown, an additional $\alpha^1$-multiplier is used to obtain multiplication by the powers of alpha otherwise missing from the illustrated configuration. For example, the input to S-accumulator latch 74b is the product of the output of adder 70ab and $\alpha^{-4}$, because the overall product of $\alpha^1$ and $\alpha^{-5}$ is $\alpha^{-4}$. It may be desirable in alternative embodiments to dispense with these area-saving features, and instead implement the syndrome calculator with a full set of stages.

The syndrome calculator 16 also contains control logic as shown in FIG. 4. The signals EVEN and LD__S are provided to an inverter 80 and a pair of AND gates 82, 84 to generate signals to selectively load and enable the outputs of the even and odd S-accumulator latches 74a–74k. Similarly, the signals EVEN and LD__SY are provided to AND gates 86 and 88 to load the even and odd S-accumulator latches 76a–76k. A combination of a counter 90 and decoders 92, 94 is used to enable the outputs of the S-accumulator latches onto the bus 78.

During operation of the syndrome calculator 16 of FIG. 4, the accumulator registers 74a–74k are preset to zero by the signal CLR before the symbols begin flowing in. As each symbol comes in, it is first exclusive-OR'd with the contents of the odd S-accumulator registers 74a, 74c, 74e, 74g, 74i, and 74k by the adders 70ab–70k; these sums are multiplied by their respective alphas in multipliers 72a, 72c, 72e, 72g, 72i, and 72k, and then stored back into the odd S-accumulator registers. The symbol is then exclusive-OR'd with the contents of the even S-accumulator registers 74b, 74d, 74f, 74h, and 74j; these sums are likewise multiplied by their respective alphas and also by $\alpha^1$ in alpha multipliers 72b, 72d, 72f, 72h, and 72j before being stored back into the even S-accumulator registers. This process is repeated for each input symbol except the last one. When the last symbol comes in, it is again exclusive-OR'd with the odd and even S-accumulator registers in successive cycles. During these cycles, however, the signal LD‾SY is asserted, and the results are stored in the corresponding ones of the S-accumulator registers 76a–76k. At this point, the syndrome accumulator registers contain all 11 of the calculated syndromes $\{Sy_{-5}, Sy_{-4}, Sy_{-3}, Sy_{-2}, Sy_{-1}, Sy_0, Sy_1, Sy_2, Sy_3, Sy_4, Sy_5\}$ for subsequent use by the error correction decoder 18 of FIG. 1.

During error correction decoding, the decoder 18 of FIG. 1 asserts the signal UNLD__SY in order to read the syndromes from the syndrome calculator 16. The counter 90 is initially loaded with a value to select the S(5) accumulator register 76k, and then simply counts so that the contents of the remaining S-accumulator registers 76j–76a are sequentially output on the bus 78. Note that the calculated syndromes are output in descending order.

Figure 5:
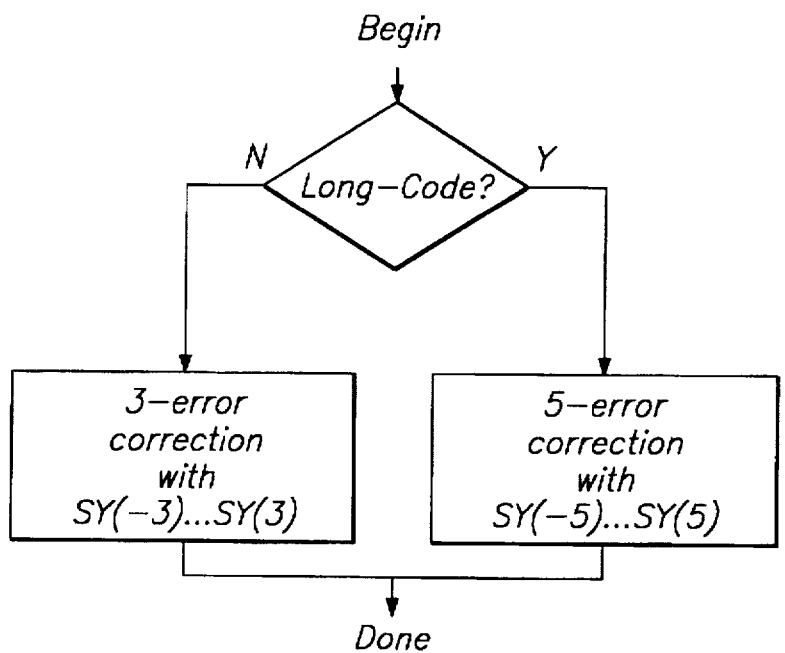
FIG. 5 is a flow diagram of the high-level operation of an error correction decoder in the system of FIG. 1.

FIG. 5 shows the high-level functioning of the error correction decoder 18 of FIG. 1. The decoder 18 is capable of performing either a 3-error correction algorithm or a 5-error correction algorithm depending on which RS code is being used, as indicated by the signal LONG‾CODE. If LONG__CODE is a logic ZERO, then the distance-8 code is being used, and the decoder 18 executes a 3-error correction algorithm using the syndromes Sy(3)–Sy(–3). If LONG‾CODE is a logic ONE, then the distance-12 code is being used, so the decoder 18 executes a 5-error correction algorithm using Sy(5)–Sy(–5). There are several known RS error correction algorithms, any of which may be employed in either case. It should be noted also that the decoder 18 may include both hardware and firmware components, where the hardware component corrects a small number of errors and the firmware component corrects any remaining errors. Such a configuration has the advantage of fast decoding in the common case where only a small number of errors occur, while minimizing the size of the hardware component. If such a decoder is employed, it is possible to use the same hardware decoding algorithm for both the codes if the hardware error-correcting power is within the correcting power of the weaker code. In such a case, the hardware decoder should be capable of selecting the proper calculated syndromes for the code being used.

While the foregoing has described a single embodiment of the invention, it will be apparent to those skilled in the art that there are a number of alternative embodiments that also fall within its scope. To begin with, the present invention may readily be used with other RS codes generated by much different generator polynomials. More specifically, the technique may also be used with generator polynomials that are of even degree; are asymmetric or only partially symmetric in their coefficients; and have non-1 coefficients in their most—and least-significant terms. When the generator polynomials are both symmetric, such as in the illustrated embodiment, the roots of the second code are always the "central" roots of first code, i.e. those roots numbered from –n to +n; otherwise, the relationship between the roots of the two codes is more arbitrary. If the most—or least-significant generator polynomial coefficients are different from 1 then the encoder will in general require corresponding alpha multipliers at the head and/or tail of the shift register.

Also, while an encoder like the one shown is particularly useful when one code is a sub-code of the other, it may also find use with code pairs having a more arbitrary relationship. The technique is also extendable to 3 or more codes, and to interleaved codes. When interleaving is employed, the single storage elements shown in FIGS. 3 and 4 can be replaced with 2 or more storage elements depending on the degree of interleaving, and the control block 22 generates correspondingly different control signals so that symbols from each interleave may be operated on in adjacent cycles.

Finally, it may be possible to find pairs of generator polynomials having some identical coefficients in like terms; in such a case, it would be possible to dispense with a corresponding alpha-multiplier multiplexer in the encoder.

Beyond the indicated alternatives, the present invention also encompasses other embodiments within the scope of the following claims.

What is claimed is:

1. An error-correction encoder comprising:
a shift register having an input coupled to a data input terminal of said encoder, the shift register having $(d_1-1)$ storage elements, where $(d_1-1)$ is the degree of a first generator polynomial defining a distance-$d_1$ Reed-Solomon (RS) code according to which a data block may be encoded and whose code symbols are elements of a predetermined Galois field having a predetermined primitive element $\alpha$;

a set of Galois-field adders interspersed among the storage elements of said shift register such that each adder provides to an input of a corresponding one of said storage elements a sum of the contents of a preceding storage element appearing on a first input of the adder and whatever value appears on a second input of the adder;

a first set of Galois-field multipliers each having a data symbol input coupled to said data input terminal and being capable of multiplying a value appearing on its data symbol input by a corresponding power of $\alpha$ appearing in said first generator polynomial;

a second set of Galois-field multipliers each having a data symbol input coupled to said data input terminal and being capable of multiplying a value appearing on its data symbol input by a corresponding power of $\alpha$ appearing in a second generator polynomial being a complete divisor of said first generator polynomial and defining a distance-$d_2$ RS code according to which said data block may be encoded and whose code symbols are, like those of said distance-$d_1$ RS code, elements of said predetermined Galois field;

means for selectively configuring said shift register so that all $(d_1-1)$ elements thereof are used when said data block is to be encoded according to said distance-$d_1$ RS code, and only $(d_2-1)$ elements thereof are used when said data block is to be encoded according to said distance-$d_2$ RS code, the elements that are used for both codes being denoted "shared" elements and the remainder being denoted "non-shared" elements;

means for coupling the output of each of predetermined ones of said first set of multipliers to the second input of a corresponding appropriate one of those of said adders that provide sums to the inputs of the non-shared elements of said shift register to effect encoding by said distance-$d_1$ RS code when said shift register is configured therefor; and means for selectively coupling the outputs of each of either the remaining ones of said first set of multipliers or all of said second set of multipliers to the second input of a corresponding appropriate one of those of said adders that provide sums to the inputs of the shared elements of said shift register to effect encoding by the corresponding one of said RS codes.

2. An error-correction decoder comprising:

a syndrome calculator having $d_1/2$ stages for generating $(d_1-1)$ error syndromes from a multi-symbol codeword encoded according to either a distance-$d_1$ Reed-Solomon (RS) code or a distance-$d_2$ RS code, roots of the distance-$d_2$ RS code generator polynomial are a consecutive subset of roots of the generator polynomials of said distance-$d_1$ RS code, the generated error syndromes being consecutively numbered to correspond to the consecutive roots of the generator polynomial of said distance-$d_1$ RS code, a first $(d_1/2)-1$ stages each including a Galois field adder receiving a symbol of the codeword, an even and an odd syndrome register having outputs connected to an input of the Galois field adder, a first $\alpha$ multiplier connected to an output of the Galois field adder, and a second $\alpha$ multiplier connected to an output of the first a multiplier, the even syndrome register receiving an output of the second $\alpha$ multiplier and the odd syndrome register receiving the output of the first $\alpha$ multiplier, and the $(d_1/2)$th stage including a Galois field adder receiving a symbol of the codeword, a first $\alpha$ multiplier connected to an output of the Galois field adder and an odd syndrome register having an output connected to an input of the Galois field adder and an input connected to the output of the first $\alpha$ multiplier;

means for indicating which of said RS codes is the one according to which said codeword is encoded; and an error-correction decoder coupled to said indicating means and to said syndrome calculator for determining presence, locations, and magnitudes of symbol errors in said codeword based on selected ones of the $(d_1-1)$ generated error syndromes that correspond to the roots of the generator polynomial of the indicated RS codes wherein sharing of the Galois field adder and a multipliers by two syndrome registers in the first $(d_1/2)-1$ stages of the syndrome calculator provides the error-correction decoder with increased correctable symbol capbility while minimizing additional hardware.

* * * * *